(12) United States Patent
Landers, Jr. et al.

(10) Patent No.: US 6,246,123 B1
(45) Date of Patent: Jun. 12, 2001

(54) TRANSPARENT COMPOUND AND APPLICATIONS FOR ITS USE

(75) Inventors: James F. Landers, Jr., Mesa, AZ (US); Robert K. Denton, Jr., Winchester, VA (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/072,053

(22) Filed: May 4, 1998

(51) Int. Cl.$^7$ ................................................. H01L 23/28
(52) U.S. Cl. ..................... 257/787; 257/431; 257/432; 257/433; 257/794; 523/444
(58) Field of Search .................... 257/787, 788, 257/791, 792, 793, 794, 431, 432, 433

(56) References Cited

U.S. PATENT DOCUMENTS

| | | |
|---|---|---|
| 3,849,383 | 11/1974 | Fetscher et al. . |
| 4,178,274 | 12/1979 | Denk et al. ............................ 260/31.8 |
| 4,843,036 | 6/1989 | Schmidt et al. ....................... 257/787 |
| 5,039,566 | 8/1991 | Skubic et al. ......................... 428/113 |
| 5,145,889 | * 9/1992 | Wade et al. ............................ 523/451 |
| 5,175,199 | * 12/1992 | Asano et al. ........................... 523/444 |
| 5,281,633 | 1/1994 | Okuno et al. .......................... 523/513 |
| 5,556,673 | 9/1996 | Giraud ................................. 428/34.4 |
| 5,614,131 | 3/1997 | Mukerji et al. ......................... 264/1.9 |
| 5,618,872 | 4/1997 | Pohl et al. ............................. 524/432 |
| 5,631,192 | 5/1997 | Heppler et al. .......................... 438/25 |
| 5,665,450 | 9/1997 | Day et al. .............................. 428/114 |
| 5,985,954 | * 11/1999 | Tsuchida et al. ...................... 523/400 |

* cited by examiner

Primary Examiner—Jhihan B Clark
(74) Attorney, Agent, or Firm—Anthony M. Martinez

(57) ABSTRACT

A mold compound made from a polymer resin and an isorefringent, transparent filler is used to form optical electronic components (10, 20, 30). The mold compound can be used to form a lens (13) on a display device (10), to form the outer housing (21) of a waveguide (20), or to form a dome (34) that reflects light from a light emitting device (32) to a light detecting device (33).

13 Claims, 2 Drawing Sheets

US 6,246,123 B1

TRANSPARENT COMPOUND AND APPLICATIONS FOR ITS USE

BACKGROUND OF THE INVENTION

This invention relates, in general, to electronic components, and more particularly to molding material used in optical components used for transmitting and receiving an optical data signal.

Many opto-electronic applications involve passing an optical signal from a signal generator to a signal detector. For example, an opto-isolator uses a light emitting diode (LED) to transmit data from one circuit to a light detector in another circuit. The use of the LED allows the two circuits to be electrically and physically isolated from each other, yet remain in communication with each other. Other examples include passing an optical signal from a light emitter to a light detector by directing an optical signal through a wave guide or optical fiber, or off a reflective dome/lens.

In all of these applications, the assembly of the optical device must be compatible with each of the individual components that make up an optical device (e.g., leadframe, leads, semiconductor devices, bonding wires, and the package). In other words, the process that is used to assemble an optical component must be tailored so as to minimize the amount of thermo-mechanical stress that is placed on the individual components and the amount of similar stress that occurs within the optical component while the component is in use by a customer.

Of the existing mold compounds that are used in the assembling of optical components, most suffer from one of three limitations. First, they often have a coefficient of thermal expansion (CTE) that causes a device to be damaged as the device undergoes wide temperature variations. Secondly, most mold compounds have a glass transition temperature (Tg) that causes the compound to become soft and rubbery under conventional assembly process conditions. Finally, existing mold compounds have an index of refraction value that is incompatible with the requirements of many optical electronic applications.

Accordingly, a need exists to provide a mold compound that is both compatible with existing assembly processing requirements and with the optical requirements of optical electronic devices.

Figure 1:
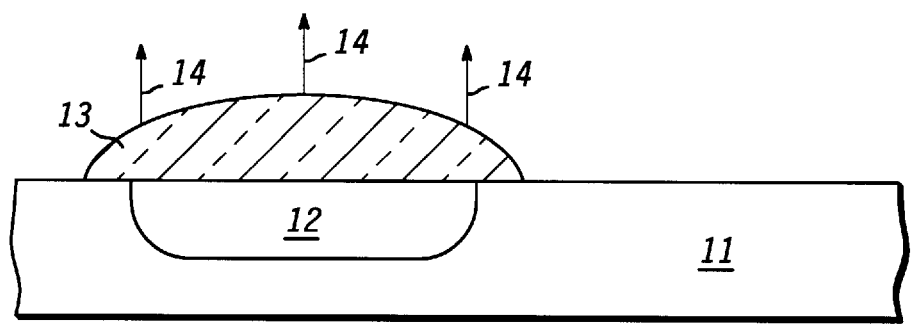
FIG. 1 is a cross-sectional view of a portion of an optical display component using a compound in accordance with an embodiment of the present invention.

It will be appreciated that for simplicity and clarity of illustration, elements illustrated in the figures have not necessarily been drawn to scale. For example, the dimensions of some of the elements are exaggerated relative to other elements for clarity. Further, where considered appropriate, reference numerals have been repeated among the figures to indicate corresponding or analogous elements.

DETAILED DESCRIPTION OF THE DRAWINGS

In general, the present invention provides a polymer composite molding compound that is ideally suited for a variety of applications of electronic and optical components. The present invention provides a compound that has the desired glass transition temperature, index of refraction, and coefficient of thermal expansion that makes the compound suitable for optical applications. In particular, the compound can have a coefficient of thermal expansion of less than 30 parts per million/ degree Celsius (PPM/° C.), a glass transition temperature in excess of 130° C., and an index of refraction ranging from about 1.50 to 1.58.

The molding compound of the present invention is a polymer composite composed of a resinous extended or matrix phase and an inorganic filler dispersed phase. For the optical applications described below, the polymer resin is preferably an epoxy resin of the chemistry known as triglycidyl isocyanurate (TGIC), which has an index of refraction of about 1.52. A filler is then dispersed in the polymer resin so that compound has physical properties that are compatible with many molding processes used in the electronics industry. A filler is a non-reactive component of the compound, which alters both the optical properties (i.e., the transparency and index of refraction) and the physical properties (i.e., polymerization shrinkage and coefficient of thermal expansion) of the compound. However, great care must be taken to select an appropriate filler that provides a compound with the desired physical properties and that meets the optical requirements for a given application.

For example, a mineral or a synthetic inorganic filler such as alkali zinc borosilicate glass, which has a index of refraction of about 1.52 is added to the polymer resin. Preferably, the individual particles of the filler have an average size of about 5 microns ($\mu$m) to 500 $\mu$m and is isorefringent (i.e., has only one value of index of refraction in normal use). The filler in accordance with the present invention is used to lower the coefficient of thermal expansion of the compound. In addition, alkali zinc borosilicate glass is ideally suited for the present invention because it has an index of refraction that is approximately equal to the index of refraction of cured TGIC. Consequently, the compound of the present invention has an index of refraction of about 1.523 and is transparent to visible and infrared light having a wavelength in excess of about 700 nanometers (nm).

Before the filler is added to the compound, it is desirable to pre-treat the filler to optimize the wetting or surface chemistry of the compound, and/or to prevent premature polymerization by minimizing the effect of filler surface chemistry on reaction rates during compounding. For example, the alkali zinc borosilicate glass particles are washed with an acid such as hydrochloric acid to remove any residual contaminants from particle reduction processes (e.g., grinding) and any organic materials. Thereafter, the alkali zinc borosilicate glass particles are coated and passivated with a silane coupling agent such as glycidoxy propyltrimethoxy silane. By treating the filler in this manner, the filler transparency is maximized and the filler-matrix bonding is improved so that the optical transparency of the compound is maximized.

It is also desirable to add a curing agent and an accelerator to the compound so that the compound is well adapted for use in transfer molding, injection molding, or compression molding processes used in the semiconductor industry. For example, hexahydrophthalic anhydride is added as a curing agent and benzyldimethylamine is added as an accelerator.

It has been discovered that forming a compound that comprises about 100 parts per weight of triglycidyl isocyanurate, 100–150 parts per hundred (PPH) resin by weight of hexahydrophthalic anhydride, 400–600 PPH resin by weight zinc borosilicate glass, and 1–5 PPH resin by weight benzyldimethylamine results in a compound that has a CTE less than about 25 PPM/° C., a glass transition temperature greater than 150° C., and an index of refraction of about 1.523.

Accordingly, the present invention results in a compound that is well suited for use in optical electronic applications. Due to the relatively low coefficient of thermal expansion, the present invention is compatible with other components that make up conventional electronic components like leadframes, bonding wires, semiconductor substrates, and conventional molding compounds. The low CTE also means that an optical component containing the compound of the present invention can be used by a consumer over a wide temperature (i.e. about −40° C. to 130° C.) without causing a failure due to internal expansion stress.

The high glass transition temperature of the present invention means that the compound is well suited for use in conventional over-molding, transfer molding, injection molding, or compression molding processes commonly used in the electronics industry. In other words, the compound of the present invention can be formed into pellets, powder, or a near-liquid state so that the compound of the present invention can replace the traditional semiconductor molding compounds or liquid "globtops" that are used to encapsulate semiconductor devices.

Finally, the compound described above has an index of refraction that ranges from about 1.50 to 1.58 and is transparent to light in the visible and infrared spectrum. This makes the compound of the present invention well suited for use in an optical isolator, a waveguide, an optical connector, or an optical display device. The transparency of a material is a term that loosely describes the amount of light of a particular wavelength that can pass through the material. In opto-electronic applications, it is generally desirable that the material allow at least 95%, or perhaps 90%–100%, of the light of a required wavelength to pass through the material. This is so the power consumption of an opto-electronic device can be minimized and its efficiency maximize. If power consumption is not of great concern in a given application, it can be acceptable to refer to a material as being transparent if it only permits 50% to 75%, 25% to 50%, 10% to 25%, or even 1% to 10% of the light to pass through the material.

In the example provided above, an isorefringent and transparent filler was selected that had a nearly identical index of refraction as the polymer-matrix. This was to ensure that the final compound would have the desired index of refraction. However, it should be understood that the index of refraction of a filler used in a compound need not be exactly the same as the polymer resin to appreciate the benefits of the present invention. By selecting a polymer resin and an isorefringent filler where the isorefringent filler has a refractive index that is within about 10 percent of the refractive index of the polymer resin, a compound can be formed that has the desired optical and physical properties.

Other compounds can be formed in accordance with the present invention by combining other families of polymer resins such as diglycydyl ether of bisphenol A (DGEBA), novolac modified DGEBA, mixtures of mono or multifunctional epoxies, acrylics, polyester, polyimide, silicone, cyanate ester, 3,4,-epoxy-cyclohexylmethyl-3,4-epoxy cyclohexane carboxylate, or styrenic. An isorefringent filler such as glasses, glass fibers, glass microspheres, glass powders, synthetic inorganics, or glass beads with an appropriate index of refraction that is compatible with and capable of refractive index adaptation to the resinous phase is added.

Additionally, a curing agent such as polyamines, nadic methyl anhydride, hexahydrophalic anhydride, anhydrides, mixtures of cyclic, aliphatic mono, and multifunctional amines or anhydrides can be added to the compound. Finally, an appropriate accelerator such as ureas, dycyandiamide (DICY), and tri-functional amines can be added to the epoxy resin.

These possible combinations can provide a compound that is well suited for a particular optical application. In general, a compound formed from these suggested chemicals can have an index of refraction ranging from about 1.4 to 1.7 and be transparent to ultraviolet light, visible light, and infrared light. A compound can be formed that allows at least 50 percent of light having a wavelength ranging from about 400 nm to 900 nm to pass through the compound, or that allows at least 90 percent of light having a wavelength ranging from about 400 nm to 900 nm to pass through the compound. The constituents of the compound can also be selected to provide a compound that has a CTE less than 35, 30, or even 25, and a glass transition temperature in excess of 130° C., 140° C., 150° C., or even 170° C.

Figure 2:
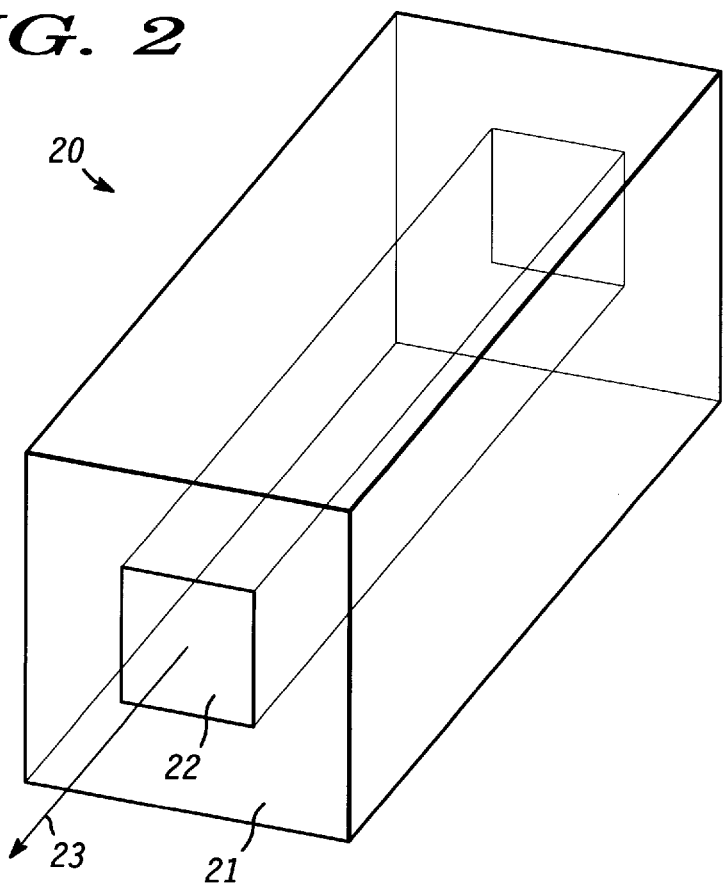
FIG. 2. is a cross-sectional view of a waveguide using the compound in accordance with an alternative embodiment of the present invention.
Figure 3:
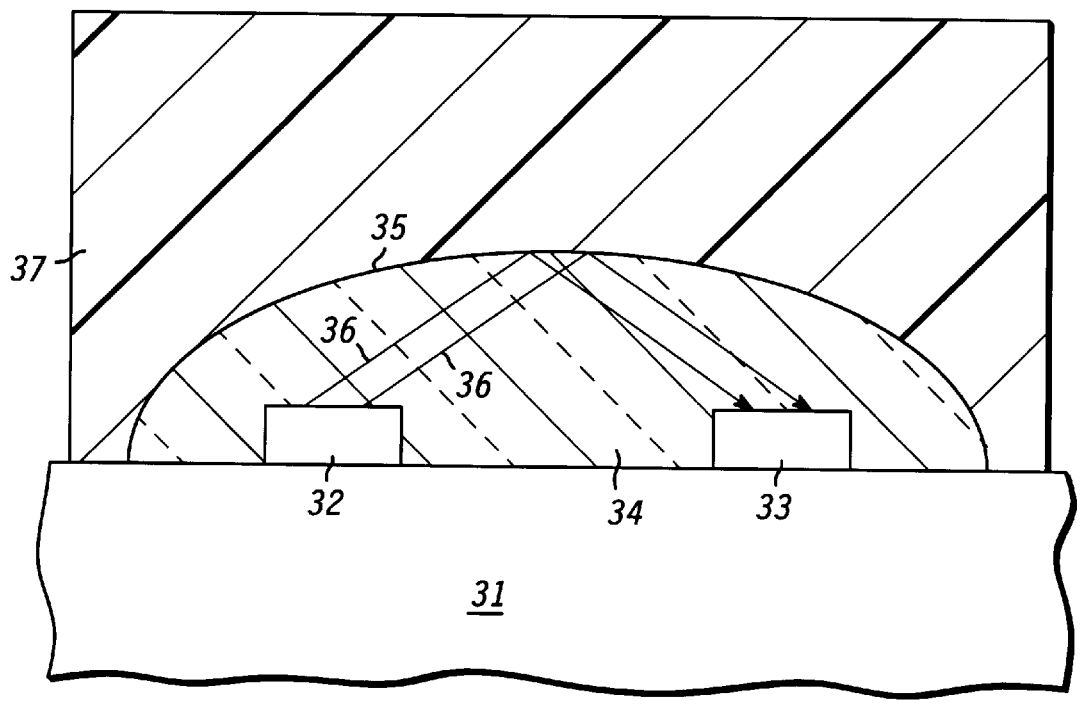
FIG. 3. is a cross-sectional view of an optical isolator using the compound in accordance with yet another alternative embodiment of the present invention.

Referring now to FIGS. 1–3, applications for the mold compound in accordance with embodiments of the present invention are now provided. FIG. 1 is a cross-sectional view of how the compound of the present invention can be used as an encapsulating material to form a lens for an electronic component such as an optical display device 10. For example, optical display device 10 can be an array of light generating diodes that are used to generate an optical image. Such electronic components are often referred to as charge coupled devices (CCD) or image metal-oxide semiconductor (iMOS) devices.

In such an application, the compound is formed over a light generating diode or a light emitter. As shown in FIG. 1, a light emitter can be created by forming a p-type region 12 in an n-type substrate 11 to form a PN junction. When a current is passed through the PN junction, light is emitted as indicated in FIG. 1 with arrows 14. Lens 13 can be formed over the light emitting device using a variety of ways including depositing a layer of the compound across substrate 11 and then patterning the layer with conventional photolithographic masking and etch techniques known in the art. Thereafter, a reflow step is performed to melt the remaining portion of the material to form the shape of lens 13 as shown in FIG. 1.

As shown in FIG. 2, the compound of the present invention can also be used to form a waveguide 20. The compound of the present invention can be used to form the outer housing 21 of waveguide 20. An alternative transparent material provides inner core 22, which is used to conduct or transport a light signal. The optical signal that is conducted by waveguide 20 is indicated in FIG. 2 with an arrow 23. Preferably, the index of refraction of the outer housing 21 is lower than the index of refraction of the inner core 22 so that the optical signal remains within inner core 22. For example, if outer housing 21 has an index of refraction ranging from about 1.50 to 1.58, then the inner core 22 should have an index of refraction less than 1.50. It should be understood that the compound of the present invention could also be used to form inner core 22 if the outer housing is formed from a material having a lower index of refraction.

Turning now to FIG. 3, an alternative application for the compound of the present invention is provided. FIG. 3 is an example of an optical isolator or opto-isolator 30. Opto-isolator 30 uses a light emitting device 32 to pass an optical signal (arrows 36) to a photodetector or light detector 33. This allows one circuit (not shown) to be physically or electrically isolated from another circuit (not shown), but allow the two circuits to be in communication with each other through the use of an optical signal (arrows 36).

In such an application, light emitter 32 (e.g. a laser such as a vertical cavity surface emitting laser (VCSEL) or light emitting diode (LED)) and light detector 33 are mounted to a support substrate 31. The compound of the present invention is then formed over light emitter 32 and light detector 33 to provide a dome 34. Optionally, an outer package 37 is formed using conventional over-molding techniques known in the art. Dome 34 encapsulates light emitter 32 and light detector 33, and has an inner surface 35 that is used to reflect the optical signal (arrow 36) from light emitter 32 to light detector 33.

By now it should be appreciated that the present invention provides a compound that can be used in a variety of optical applications. The compound has the desirable physical properties so that the compound can readily be used in conventional molding processes. The compound also has a sufficiently low coefficient of thermal expansion so that the stress that occurs within a device while in operation is minimized. In addition, the present invention provides a compound that allows the index of refraction to be tailored to specific customer or electro-optical technology based requirements.

It should also be understood that the teachings of the present invention can be incorporated with other semiconductor devices to provide a multi-functional integrated circuit such as a microcontroller or a microprocessor.

What is claimed is:

1. An electronic component comprising:
    a semiconductor device; and
    an encapsulating material overlying at least a portion of the semiconductor device, wherein the encapsulating material comprises triglycidyl isocyanurate, alkali zinc borosilicate glass, and hexahydrophthalic anhydride.

2. The electronic component of claim 1 wherein the encapsulating material further comprises an accelerator selected from the group consisting of benzyldimethylamine, ureas, dycyandiamide, and tri-functional amines.

3. The electronic component of claim 1 wherein the encapsulating material has a coefficient of thermal expansion of less than about 30 PPM/° C.

4. The electronic component of claim 1 wherein the encapsulating material has a glass transition temperature in excess of about 130° C.

5. The electronic component of claim 1 wherein the encapsulating material has an index of refraction ranging from about 1.4 to 1.7.

6. The electronic component of claim 1 wherein the semiconductor device further comprises:
    a semiconductor substrate; and
    a PN junction in the semiconductor substrate to provide the semiconductor device, wherein the encapsulating material is overlying at least a portion of the PN junction.

7. The electronic component of claim 1 wherein the encapsulating material allows at least 50 percent of light directed to the encapsulating material and having a wavelength ranging from about 400 nm to 900 nm, to pass through the encapsulating material.

8. The electronic component of claim 1 wherein the encapsulating material allows at least 90 percent of light directed to the encapsulating material and having a wavelength ranging from about 400 nm to 900 nm, to pass through the encapsulating material.

9. The electronic component of claim 1 wherein the encapsulating material is transparent to ultraviolet light, visible light, or infrared light.

10. The electronic component of claim 5 wherein the encapsulating material has an index of refraction ranging from about 1.50 to 1.58.

11. An electronic component having an encapsulating material, wherein the encapsulating material comprises:
    a polymer resin selected from the group consisting of triglycidyl isocyanurate, diglycydyl ether of bisphenol A, novolac modified DGEBA, mixtures of mono or multifunctional epoxies, acrylics, polyester, polyimide, silicone, cyanate ester, cycloaliphatic epoxy resins, 3,4,-epoxy-cyclohexylmethyl-3,4-epoxy cyclohexane carboxylate, and styrenic;
    an isorefringent filler selected from the group consisting of alkali zinc borosilicate glass, glasses, glass fibers, glass microspheres, glass powders, synthetic inorganics, and glass beads; and
    wherein the encapsulating material comprises a curing agent selected from the group consisting of hexahydrophthalic anhydride, polyamine, nadic methyl anhydride, hexahydrophalic anhydride, anhydrides, mixtures of cyclic, aliphatic mono, multifunctional amines, and multifunctional anhydrides.

12. The electronic component of claim 11 wherein the encapsulating material comprises an accelerator selected from the group consisting of benzyldimethylamine, ureas, dycyandiamide, and tri-functional amines.

13. An electronic component having an encapsulating material, wherein the encapsulating material comprises:
    a polymer resin selected from the group consisting of triglycidyl isocyanurate, diglycydyl ether of bisphenol A, novolac modified DGEBA, mixtures of mono or multifunctional epoxies, acrylics, polyester, polyimide, silicone, cyanate ester, cycloaliphatic epoxy resins, 3,4,-epoxy-cyclohexylmethyl-3,4-epoxy cyclohexane carboxylate, and styrenic;
    an isorefringent filler selected from the group consisting of alkali zinc borosilicate glass, glasses, glass fibers, glass microspheres, glass powders, synthetic inorganics, and glass beads; and
    wherein the electronic component is an optical isolator, a waveguide, an optical connector, or an optical display device and wherein the encapsulating material has an index of refraction of about 1.50 to 1.58.

* * * * *